United States Patent [19]
Mihalich

[11] Patent Number: 4,931,426
[45] Date of Patent: Jun. 5, 1990

[54] PROCESS FOR PREPARING CRYSTALLINE CERAMIC SUPERCONDUCTOR MATERIALS BY FLUIDIZED-BED CALCINATION

[75] Inventor: Herman C. Mihalich, Newtown, Pa.

[73] Assignee: Rhone-Poulenc Inc., Princeton, N.J.

[21] Appl. No.: 188,811

[22] Filed: May 2, 1988

[51] Int. Cl.$^5$ .................. C22C 29/12; C23C 8/10; H01L 39/12

[52] U.S. Cl. .................. 505/001; 204/192.24; 252/521; 266/81; 423/593; 420/901; 427/62

[58] Field of Search .................. 505/1; 427/62; 204/192.24; 420/901; 75/0.5 A; 266/81; 252/521; 423/593

[56] References Cited

U.S. PATENT DOCUMENTS 4,775,412 10/1988 Nishikura et al. .................. 75/0.5 A
4,778,517 10/1988 Kopatz et al. .................. 75/0.5 A

OTHER PUBLICATIONS

Kodas et al, in HighTemp. Superconductors II, ed. Capone II, Apr. 5–9, 1988, Reno, Nev., p. 367.
Davison et al, MRS–Proc., vol. 99, High T–Superconductors, Nov. 30, Dec. 4, 1987, Boston, ed. Brodsky et al, p. 289.
Nasu et al, in High $T_c$–Superconductors II, Apr.–4, 1988, Reno, MRS-Extended Abs., ed. Capone et al, p. 101.
Iqbal et al, in MRS–Proc., vol. 99, 1987, Boston, ed. Brodsky et al., p. 907.
Liu et al, in Proc. Mrs.–vol. 99, 1987, ed. Brodsky et al, p. 253.
Kuwabata, Jap. Jour. Appl. Phys. 26, (Nov. 1987), L–1821.
Fujiki et al, Jap. Jour. Appl. Phys., 26, (Jul. 1987) L–1159.

Primary Examiner—Upendra Roy

[57] ABSTRACT

A process is provided for preparing crystalline ceramic superconductor materials, which comprises preparing a mixture of particulate crystalline ceramic superconductor precursors selected to form upon heat processing a crystalline ceramic superconductor material; subjecting said mixture to calcination at an elevated reaction temperature sufficient to form a crystalline ceramic material, while entraining and fluidizing said mixture in a flow of hot calcining gas; and then quenching the crystalline ceramic material to a temperature below calcination temperature; the quenching step can be followed by annealing and cooling the resulting crystalline ceramic material in the presence of oxygen to form and maintain a selected superconducting crystalline structure in the material.

10 Claims, 1 Drawing Sheet

PROCESS FOR PREPARING CRYSTALLINE CERAMIC SUPERCONDUCTOR MATERIALS BY FLUIDIZED-BED CALCINATION

BACKGROUND OF THE INVENTION

Description of the Related Art

The remarkable discovery by Bednorz and Muller of a new class of ceramics which exhibit superconductivity to unprecedented high temperatures (Bednorz and Muller, *Zeitschrift fur Physik B* 64, 189–193 (1986); Bednorz, Takashige and Muller, *Europhysics Letters*, 3, 379–385 (1987); Bednorz, Muller and Tagashige, *Materials Research Bulletin*) has triggered an unprecedented race in research laboratories around the world to investigate the properties of these materials, and to develop new materials of this type. Since then, it has been established that the polyphase material is a mixture of a green phase and a black phase, and that the superconducting phase is the black phase, an yttrium barium cuprate having the composition $Y_1Ba_2Cu_3O_{9-x}$. Additional superconducting materials that have been identified include a new $K_2NiF_4$ type perovskite, with a composition $Ba_2CuO_3$, a $ABO_3$ perovskite of composition $YBa_3Cu_2O_9$, and an additional phase of composition $Ba_3CuO_4$. The perovskite of the potassium nickel fluorite type has a tetragonal symmetry.

Following Bednorz and Muller's suggestion that a perovskite of the potassium nickel fluorite ($K_2NiF_4$) type was responsible for the observed high Tc, workers at the University of Tokyo confirmed that the phase has indeed the tetragonal symmetry of $K_2NiF_4$ with the stoichiometry $La_{2-x}Ba_xCuO_4$. Such oxygen-defect perovskites can be thought of as consisting of alternating intergrowths of perovskite- and sodium chloride type layers. The structure is made up of planes of $CuO_6$ octahedra sharing corners, separated by (La, Sr)O layers within which the La and Sr are ninefold coordinated to oxygen. As a result, the copper-oxygen bonding is distorted with the copper assuming a planar fourfold coordination with oxygen. In the $La_2CuO_4$, all the copper is $Cu^{2+}$ and the structure has a slight orthorhombic distortion. Substitution of Ba or Sr for La oxidizes some of the copper to $Cu^{3+}$ by ordering of oxygen vacancies to give a mixed valence compound and decreases the orthorhombicity of the $K_2NiF_4$ structure. A number of groups have explored the superconductivity as a function of the degree of substitution x and have found that the superconducting transition is a maximum at a value of $x=0.15$. This corresponds to being near to what is believed to be a metal-insulator transition.

Clarke, *Advanced Ceramic Materials*, Volume II, No. 3B, Special Issue (1987), page 278, has pointed out that the processing atmosphere and annealing treatments are very important in attaining good superconductivity.

The sharpest transition occurs after slow cooling in oxygen and is degraded by either annealing in too high an oxygen partial pressure or in too low an oxygen partial pressure. Quenching from too high a temperature, even in oxygen, adversely affects the transition.

The intercalation of oxygen and the effect of annealing treatments as well as quenching can be interpreted in structural terms primarily as affecting the oxygen occupancy on the copper plane lying between the barium ions. This is based on the results of neutron diffraction and supports the idea that there is an optimum oxygen stoichiometry for high temperature superconductivity. The prevailing view at the present time is that it is the perfection of the $CuO_2$ "ribbons" or "chains" created by oxygen vacancy ordering in the basal plane that is critical for high values of the superconducting transition temperature Tc. In this interpretation, deviations from the ideal structure caused by the addition (high oxygen pressure) or removal (low oxygen pressure) of oxygen from the copper-oxygen plane between the barium ions will result in lowering of the transition temperature.

One of the consequences of the processing atmosphere and temperature is that the orthorhombic distrotion of the unit cell alters. Above a certain temperature the unit cell becomes tetragonal and samples quenched from this tetragonal state do not exhibit 90° K. superconductivity. Using neutron diffraction, it has been established that the orthorhombic-to-tetragonal transition occurs when the oxygen stoichiometry falls to a value of 6.5, and that the temperature at which this transition occurs depends on the oxygen partial pressure of the experiment. In terms of the unit cell description, as oxygen leaves the Cu—O—Cu chains in the orthorhombic cell the stoichiometry falls until at a value of 6.5 the oxygen ions disorder between sites in the basal plane in the a and b axes making them equivalent and thereby causing the cell to become tetragonal. Thus, if a sample is quenched from above the phase transition temperature, the oxygen ions will not form the Cu—O—Cu chains and superconductivity will be lost.

A rather dramatic illustration of the importance of processing is that the single phase $La_2CuO_4$ material has been known for many years to be insulating, yet recently groups at both IBM Almaden and Grenoble have shown that it can be converted to exhibit superconductivity with an onset as high as 40° K. by annealing in air at about 950° C. Furthermore, the superconductivity can be reversibly created and destroyed by alternating heat treatments in an oxidizing and reducing atmosphere.

Engler et al *Chemistry of High Temperature Superconductors*, (a publication of the American Chemical Society (1987)) Chapter 25, Processing, Structure, and High-Temperature Superconductivity, has commented that "Quite early it was recognized that the superconducting properties of $Y_1Ba_2Cu_3O_{9-y}$ depended on the processing conditions (Grant et al *Phys. Rev.* B1 1987, 35, 7242; Engler et al *J. Amer. Chem. Soc,* 1987, 109, 2848). This can be understood by considering the idealized structure of $Y_1Ba_2Cu_3O_{9-y}$ which involves an ordering of Ba—Y—Ba in triplets (5) and in principle, can accommodate nine oxygens. Experimentally, however, this value has been determined to be approximately seven. How the oxygens distribute themselves in the structure turns out to be very dependent on processing conditions and is the key to achieving the highest and sharpest superconducting transitions."

An example of the preparatory procedure that has been utilized is given by Poeppel et al, Chapter 24, of the same text. Poeppel et al tried to develop a reliable procedure to fabricate $YBa_2Cu_3O_7$. The solid state reaction method was used. Barium carbonate $BaCO_3$, $Y_2O_3$ and CuO were wet-milled, and the excess fluid then evaporated off. Other precursor materials such as BaO and $Cu_2O$ have also been used. Next the raw powder is subjected to calcination, a step which Poeppel et al state "has proved to be surprisingly critical in the production of good superconductive material."

Apparently, the BaCo$_3$—CuO system can preferentially form a eutectic at about 875° C., causing a phase separation that inhibits the formation of the desired 1-2-3 compound. Also, there seems to be a difference in relative reaction rates. In binary tests, the reaction of BaCO$_3$ with CuO to form BaCuO$_2$ is much faster than the reaction of Y$_2$O$_3$ with either CuO (forming Y$_2$Cu$_2$O$_5$) or BaCO$_3$ (forming Y$_2$Ba$_4$O$_7$). The difference in reaction rates again leads to phase separation. Improperly calcined material is very hard and shows excessive grain growth. To overcome the problems observed, two empirical procedures have been developed.

The first procedure uses a long-term precalcine ($\geqq$24 h) at 850° C. to decompose the carbonates below the eutectic and form the 1-2-3 compound as the major phase. This material is then lightly ground and final-calcined at 950° C. for about 2 h in a laboratory kiln which reaches a temperature in about 15 min.

A second method is a slight variation of the first. The raw powders are taken to a temperature of 950° C. for 2 to 6 h in the same quick-firing kiln mentioned above, cooled and reground, and the procedure repeated for a total of three calcinations. The powders are then checked for phase compositions by x-ray diffraction (XRD). Chemical analysis was performed using inductively coupled plasma-atomic absorption analysis and has confirmed that the composition of these powders is correct to within the accuracy of the device.

An interesting aspect of both of these procedures is that a fast heat-up rate on the final 950° C. calcine appears to be crucial to success. A second puzzling aspect of this system is that if one tries to sinter powders at temperatures of 950° to 975° C. which have only been calcined to 850° C., poor superconducting materials will result, even though XRD shows the powder to be pure 1-2-3. It appears that calcination temperatures must be greater than 900° C. to ensure good properties.

Following formation of the YBa$_2$Cu$_3$O$_7$ adding calcination, the particle size is reduced, and the resulting powder is then sintered to form the final dense ceramic. The powder is formed into the desired shape or configuration, and then sintered under a flowing oxygen atmosphere to encourage equilibrium oxygen stoichiometry.

Calcination of a stationary bed of material is not a satisfactory method. It does not provide precise temperature control throughout the bed, nor is it possible to obtain a uniform application and distribution of heat, or good contact between the material and the clacination atmosphere. Poor temperature control can cause melting, and the formation of undesirable crystal phases. (Cima and Rhine, "Powder Processing for Microstructural Control in Ceramic Superconductors", *Advanced Ceramic Materials*, Vol. 2, No. 3B, Special Issue, 1987, p. 329).

Nonhomogeneous heating does not allow uniform decomposition and reaction of the material (Ibid. p. 330).

Poor air or oxygen contact restricts the oxygen content of the material, which reduces downstream processing flexibility (Clarke, Ibid., p. 281).

Producing large quantities of uniform material is particularly difficult, because of these problems.

SUMMARY OF THE INVENTION

In accordance with the present invention, these difficulties are overcome by subjecting the mixture of particulate ceramic superconductor precursors to calcination at an elevated reaction temperature sufficient to form a crystalline ceramic material while entraining and fluidizing said mixture in a flow of hot calcining gas. This ensures precise temperature control, uniform application and distribution of heat, and good contact between the precursor material and the calcining gas.

Accordingly, the process of the invention for preparing crystalline ceramic superconductor materials comprises:

(1) preparing a mixture of particulate ceramic superconductor precursors selected to form upon heat processing a crystalline ceramic superconductor material;

(2) subjecting said mixture to calcination at an elevated reaction temperature sufficient to form a crystalline ceramic material, while entraining and fluidizing said mixture in a flow of hot calcining gas;

(3) quenching the crystalline ceramic material to a temperature below calcination temperature; and then annealing and slow cooling the resulting crystalline ceramic material in the presence of oxygen to form and maintain a selected superconducting crystalline structure in the material.

DESCRIPTION OF THE PREFERRED EMBODIMENT

Figure 1:
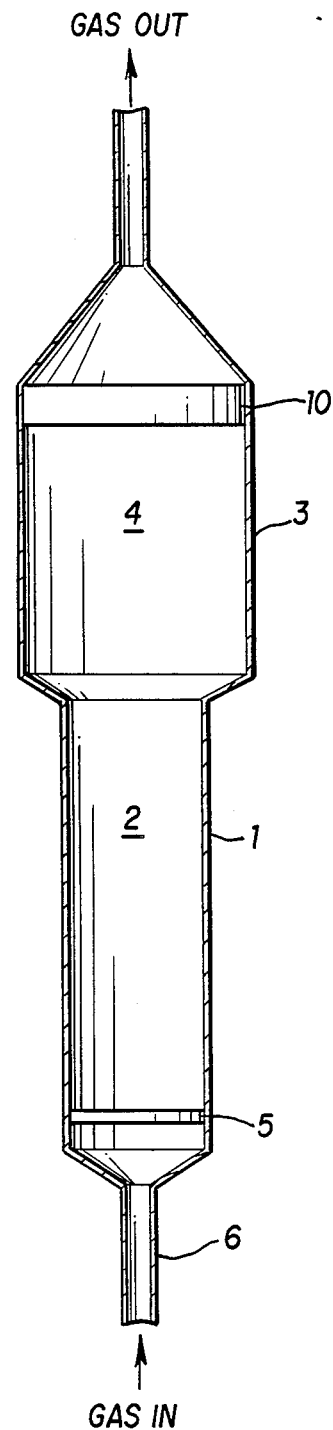
FIG. 1 shows schematically an apparatus for use in accordance with the invention, for subjecting a fluidized mixture of particulate ceramic superconductor precursors to calcination under the selected processing conditions.

The fluidized bed calcination reactor shown in FIG. 1 is in the form of a cylinder 1 defining an elongated calcination reaction zone 2 with an expanded region 3 at the top, defining a quiescent zone 4 where upwardly moving precursor particles tend to settle out and fall back into the reaction zone 2, and a filter 10 retaining the precursor particles within the reactor. At the bottom of the reactor is a sieve plate 5 for retaining the particles in the reaction zone 2 above. The hot calcining gas, which can be any gas or mixture of gases, both inert and reactive as required for the calcination, such as air, oxygen, nitrogen, CO$_2$, CO and others, is passed upwardly through the sieve plate from the inlet 6 into the reaction zone, having previously been heated to the selected calcining temperature, usually from about 750° to about 1050° C. Usually, it is sufficient for heating the ceramic precursor material to a calcination temperature simply to heat the calcining gases, but if required the reaction zone 2 can be jacketed, and provided with heating elements (not shown).

The sieve plate uniformly distributes the hot gas or mixture of gases into the reaction zone, and the gases fluidize and entrain the particulate material in the zone. The particles that are entrained in the fluid flow are carried upwardly into the quiescent zone 4, within the expanded region, where they lose velocity and fall back. The filter ensures that any particles that do not fall back are retained in the reactor.

The following Examples illustrate application of this apparatus to the process of the invention, and represent preferred embodiments of that process.

EXAMPLE 1

An aqueous solution (85 l) of 6.1 kg barium nitrate, 3.2 kg yttrium nitrate, and 6.7 kg copper nitrate was spray-dried to form a friable, dry powder.

The dry powder was introduced into the reactor of FIG. 1 from the top. Preheated air was introduced through the sieve plate at a linear velocity in the reactor of 25 feet per minute. The air was preheated to a calcination temperature of 900° C. to provide fast heating. The air flow was continued, holding the product in a fluidized bed, at 900° C. for 6 hours. The completely reacted crystalline ceramic material formed during the calcination at 900° C. was then quenched quickly to 550° C. by introducing ambient air at the same linear velocity of 25 feet per minute. The quenching avoided the formation of undesirable, unstable crystalline phases which form in the 800° C. to 875° C. range. The material reached 550° C. in 30 minutes. The material was then held at 550° C. in flowing air for 4 hours, to begin the annealing process. After the 4 hour hold, the material was cooled slowly (1° C./min.) in flowing air to ambient temperature. The slow cooling allowed the transition from the tetragonal to the orthorhombic phase to be completed.

EXAMPLE 2

The aqueous barium-yttrium-copper nitrates solution of Example 1 was spray-dried and then introduced into the fluid bed reactor of FIG. 1, and then heated slowly (1° C./min) to the calcination temperature of 900° C., held at that temperature for 6 hours, while fluidized in a 25 ft/min flow of air, and then cooled slowly to ambient while fluidized (1° C./min) in a flow of air at ambient temperature. The slow cooling allowed the transition from the tetragonal to the orthorhombic phase to be completed.

EXAMPLE 3

The aqueous Ba—Y—Cu nitrate solution of Example 1 was spray-dried and then introduced into the fluid bed reactor of FIG. 1, heated quickly to 850° C. (10° C./min) and then heated slowly to 900° C. (1° C./min) in a stream of preheated air (900° C.) introduced at a rate of 30 ft/min through the sieve plate, and held at this temperature for 6 hours. The fluidized bed was then quenched to 600° C. (10° C./min) in an air stream at 600° C. and at a rate of 30 ft/min, and held at 600° C. with $O_2$-containing gas flowing at a rate of 30 ft/min for an additional 6 hours. The bed was then cooled at 1° C./min to ambient temperature while fluidized in a flow at 30 ft/min linear velocity. The slow cooling allowed the transition from the tetragonal to the orthorhombic phase to be completed.

EXAMPLE 4

An aqueous colloidal yttrium oxide solution was combined with copper and barium nitrates, and then spray-dried. The dry powder was introduced into the fluid bed reactor of FIG. 1, and heated quickly to 900° C. (15° C./min) in a stream of air at a rate of 25 ft/min preheated to 900° C., and held fluidized in the stream, with flow at 25 ft/min at 900° C. for 8 hours. The powder was quenched to 550° C. (10° C./min) in a stream of 550° C. air at a rate of 25 ft/min and held at 550° C. for 4 hours. The powder then was cooled slowly to ambient (1° C./min) in a flow of cooling air at a rate of 25 ft/min. The slow cooling allowed the transition from the tetragonal to the orthorhombic phase to be completed.

EXAMPLE 5

The Ba—Y—Cu aqueous nitrate solution of Example 1 was spray-dried and the powder then introduced into the fluid bed reactor of FIG. 1. The powder was fluidized and heated quickly to 920° C. (10° C./min) in a stream of air preheated to 920° C. at a flow rate of 20 ft/min linear velocity and held fluidized in the stream at 920° C. for 4 hours. The calcined powder was then quenched to ambient (20° C./min) while fluidized in a stream of ambient air at 20 ft/min linear velocity. The quenching froze the material in the tetragonal (nonsuperconducting) phase. This material can be converted to the orthorhombic (superconducting) phase by annealing during the formation process.

EXAMPLE 6

The improved result obtained by calcining in a fluidized bed, instead of in a stationary bed, is demonstrated by the following experiment.

The aqueous Ba—Y—Cu nitrates solution of Example 1 was spray-dried, and then separated into two portions.

One portion was calcined in a stationary bed 3 cm deep in flowing of air preheated to 850° C., heated to the calcining temperature at a rate of 50° C./min, and held at 850° C. for five hours. The bed was then cooled to ambient temperature in flowing ambient air. Another portion was calcined in a stationary bed 3 cm deep with no air flowing at the same temperature and heated at the same rate.

The two beds were then analysed to determine the relative proportions of the undesirable $Y_2BaCuO_5$ and $BaCuO_2$ phases.

Samples taken at 1 cm depth from the bed calcined in flowing air showed a lower proportion of undesirable phases than the samples taken from 1 cm depth from the bed calcined without flowing air, illustrating the beneficiary effect of the flowing air at the surface. However, the flowing air had very little effect on the samples taken at 2.5 cm depth. Samples taken at the 2.5 cm level from both beds contained higher proportions of undesirable phases than the sample taken at 1 cm from the bed calcined in flowing air.

Another portion of powder was calcined exactly as described in Example 1. The proportion of undesired phases was appreciably lower than in the samples from the stationary bed, even those at the surface, and the powder particles all had the same phase composition; demonstrating the desirable effects of intimate contact with the gases in the fluid bed, and the uniform and controlled application of heat in the fluid bed.

The process and apparatus of the invention can be used for the calcination of any particulate ceramic superconductor precursors to form crystalline ceramic materials that can be converted into crystalline ceramic superconductors and the calcination conditions as well as the preceding and subsequent steps are selected according to the precursors and the crystalline ceramic superconductor material that is to be prepared. These are known, and form no part of the instant invention, which is directed to the calcination of entrained and fluidized ceramic superconductor precursors in a flow of hot calcining gas at an elevated reaction temperature sufficient to form a crystalline ceramic material that can be converted into the selected crystalline ceramic superconductor material. However, the following description is offered, as a guide to assist those skilled in the art in selecting appropriate conditions.

The invention is applicable to the calcination of rare earth, barium, strontium, and copper precursor compounds, including the oxides, carbonates, nitrates, alkoxides, acetates, oxalates, formates, sulphites, nitrites and benzoates. While yttrium is the principal rare earth compound, lanthanum, neodymium, dysprosium, erbium, europium, holmium, ytterbium and samarium compounds also can be used.

The first stage of the process is to form a mixture in the desired stoichiometric proportions, according to the ceramic superconductor material to be preared, and reduce the mixture to particulate form, made up of particles small enough to be susceptible of being entrained and fluidized in the flow of hot calcining gas in the calcination reactor. Dry mixing, precipitation, spray drying, evaporation drying and other conventional mixing procedures can be used.

In the calcination reactor, a suitable calcination temperature is maintained, within the usual range of from about 750° to about 1050° C., according to the precursors and the ceramic superconductor material to be formed. This temperature can be reached by controlling the temperature and the flow of entraining gases, and the temperature is maintained for a sufficient time to complete or substantially complete the reaction.

The product at elevated temperatures above about 600° C. is normally the tetragonal oxygen-deficient pervoskite oxide. This material although crystalline is not a superconductor, but can be regarded as a ceramic superconductor precursor. The superconducting crystalline phase is the orthorhombic crystal structure. The transition between tetragonal and orthorhombic structures occurs at approximately 500° to 600° C. Accordingly, when the tetragonal perovskite oxide formed in the calcination is cooled slowly with oxygen at 600° C. and below, the transition to the superconducting orthorhombic phase occurs.

It accordingly follows that if the tetragonal perovskite oxide formed in the calcination is quenched quickly through the 500° to 600° C. transition temperature without dwell time, and brought to room temperature, the tetragonal structure is retained, and this material can then be formed into any desired shape by sintering at high temperature, according to the sintering temperature of the material, and then annealed at approximately 500° to 600° C. and cooled slowly with oxygen to form the superconducting orthorhombic phase.

Alternatively, the tetragonal perovskite oxide can be held at the transition temperature in the calcination reaction zone while entrained and fluidized in a flow of oxygen or oxygen mixed with other gases such as nitrogen to form the orthorhombic phase, which is then cooled to room temperature by gradually lowering the temperature of the oygen or oxygen gas mixture.

In all cases, a quick quench to the 500° to 600° C. range is necessary, to avoid the formation of undesirable, unstable crystalline phases which form in the 800° to 875° C. range, but tend to react with water and carbon dioxide in the air.

This powder can then be used directly or formed into a selected shape using conventional means, but always below 500° C. to avoid conversion of the orthorhombic phase back to the tetragonal phase.

The powder can be formed into any desired shape or configuration in many ways. Exemplary types of forms and forming processes include:

| Superconductor Form | Formation Process |
| --- | --- |
| 1. Thin films | Sputtering of an oxide target |
|  | Application of an ink made with |

| Superconductor Form | Formation Process |
| --- | --- |
|  | fine superconductor powder to a substrate |
| 2. Thick films | Tape casting |
|  | Plasma spraying |
| 3. Wires | Extrusion/spinning |
| 4. Monolithic shapes | Slip casting |
|  | Hot isostatic pressing |

These techniques typically require sintering and annealing after forming. However, techniques like explosive bonding are being investigated that eliminate the need for sintering at high temperature. Such techniques require an orthorhombic starting powder since these techniques avoid processing at temperatures above the tetragonal/orthorhombic transition, and thus avoid the need for annealing.

As Examples, the following superconducting ceramic materials can be prepared by the calcination apparatus and process of the invention:

| Superconducting Ceramic Material | Precursors | Calcination Temp. °C. |
| --- | --- | --- |
| $YBa_2Cu_3O_7$ | Nitrates | 750–1050 |
| $YBa_2Cu_3O_7$ | Colloidal oxide and nitrate mixture | 750–1050 |
| $YBa_2Cu_3O_7$ | Oxalates | 750–1050 |
| $YBa_2Cu_3O_{7-x}$ | Nitrates | 750–1050 |
| $YBa_2Cu_3O_{7-x}$ | Colloidal oxide and nitrate mixture | 750–1050 |
| $YBa_2Cu_3O_{7-x}$ | Oxalates | 750–1050 |
| $LaBa_2Cu_3O_7$ | Nitrates | 750–1050 |
| $LaBa_2Cu_3O_7$ | Colloidal oxide and nitrate mixture | 750–1050 |
| $LaBa_2Cu_3O_7$ | Oxalates | 750–1050 |
| $LaBa_2Cu_3O_{7-x}$ | Nitrates | 750–1050 |
| $LaBa_2Cu_3O_{7-x}$ | Colloidal oxide and nitrate mixture | 750–1050 |
| $LaBa_2Cu_3O_{7-x}$ | Oxalates | 750–1050 |
| $La_2CuO_4$ | Nitrates | 750–1050 |
| $La_2CuO_4$ | Colloidal oxide and nitrate mixture | 750–1050 |
| $La_2CuO_4$ | Oxalates | 750–1050 |
| $La_{2-x}Ba_xCuO_{4-y}$ | Nitrates | 750–1050 |
| $La_{2-x}Ba_xCuO_{4-y}$ | Colloidal oxide and nitrate mixture | 750–1050 |
| $La_{2-x}Ba_xCuO_{4-y}$ | Oxalates | 750–1050 |

Having regard to the foregoing disclosure, the following is claimed as the inventive and patentable embodiments thereof:

1. In the process for preparing crystalline ceramic superconductor materials from
a mixture of ceramic superconductor precursors selected to form upon heat processing a crystalline ceramic superconductor material; the improvement which comprises:
preparing the mixture from solid particulate ceramic superconductor precursors;
subjecting said mixture to calcination at an elevated reaction temperature sufficient to form a crystalline material while entraining and fluidizing said mixture in a flow of hot calcining gas;
quenching the crystalline ceramic material to below calcination temperature; and annealing and cooling the crystalline ceramic material obtained after quenching in the presence of oxygen to form a superconducting crystalline structure.

2. A process according to claim 1 in which the annealing is carried out at a temperature within the range from about 500° to about 600° C., and the cooling is carried out in a flow of oxygen containing gas while cooling from the annealing temperature to room temperature.

3. A process according to claim 1 in which the elevated calcining reaction temperature is within the range from about 750° to about 1050° C.

4. A process according to claim 1 in which the quenching is carried out to a temperature below 500° C.

5. A process according to claim 1 in which the quenching is carried out to a temperature within the range from about 500° to about 600° C. and annealing is then carried out at the same temperature in the presence of a flow of oxygen containing gas.

6. A process according to claim 1 in which the ceramic superconductor precursor mixture is a mixture of barium carbonate, yttrium oxide and cupric oxide.

7. A process according to claim 1 in which the mixture is made up of precursors in a stoichiometric proportion according to the ceramic superconductor material being formed.

8. A process according to claim 1 in which the ceramic superconductor precursor mixture is a mixture of colloidal yttrium oxide, copper nitrate, and barium nitrate.

9. A process according to claim 1 in which the ceramic superconductor precursor mixture is a mixture of yttrium nitrate, copper nitrate, and barium nitrate.

10. A process according to claim 1 in which the ceramic superconductor precursor mixture is a mixture of yttrium carbonate, barium carbonate, and copper hydroxide.

* * * * *